(12) United States Patent
Haba et al.

(10) Patent No.: US 8,907,500 B2
(45) Date of Patent: Dec. 9, 2014

(54) MULTI-DIE WIREBOND PACKAGES WITH ELONGATED WINDOWS

(71) Applicant: Invensas Corporation, San Jose, CA (US)

(72) Inventors: Belgacem Haba, Saratoga, CA (US); Wael Zohni, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 13/758,412

(22) Filed: Feb. 4, 2013

(65) Prior Publication Data

US 2014/0217617 A1    Aug. 7, 2014

(51) Int. Cl.
| | |
|---|---|
| H01L 23/48 | (2006.01) |
| H01L 23/52 | (2006.01) |
| H01L 29/40 | (2006.01) |
| H01L 25/07 | (2006.01) |

(52) U.S. Cl.
CPC ..................................... *H01L 25/07* (2013.01)
USPC ................... 257/777; 257/E25.013; 257/685; 257/686; 438/108

(58) Field of Classification Search
CPC ................. H01L 25/0657; H01L 2924/15311; H01L 2224/48091; H01L 2924/01079
USPC .......... 257/E23.011, 685, 686, 698, 777, 778, 257/E25.013, E21.614; 438/108, 109; 361/760
See application file for complete search history.

(56) References Cited

U.S. PATENT DOCUMENTS

| | | | |
|---|---|---|---|
| 5,148,265 A | 9/1992 | Khandros et al. | |
| 5,148,266 A | 9/1992 | Khandros et al. | |
| 5,679,977 A | 10/1997 | Khandros et al. | |
| 5,811,879 A | 9/1998 | Akram | |
| 6,518,655 B2 * | 2/2003 | Morinaga et al. | 257/678 |
| 6,600,221 B2 * | 7/2003 | Kimura | 257/686 |
| 6,703,713 B1 * | 3/2004 | Tseng et al. | 257/777 |
| 7,402,911 B2 * | 7/2008 | Thomas et al. | 257/777 |
| 8,294,255 B2 * | 10/2012 | Kim | 257/692 |
| 8,304,881 B1 * | 11/2012 | Haba et al. | 257/686 |
| 8,338,963 B2 * | 12/2012 | Haba et al. | 257/777 |
| 8,436,458 B2 * | 5/2013 | Haba et al. | 257/686 |
| 2003/0064547 A1 * | 4/2003 | Akram et al. | 438/108 |
| 2010/0295166 A1 * | 11/2010 | Kim | 257/692 |
| 2012/0313239 A1 | 12/2012 | Zohni | |
| 2012/0313253 A1 | 12/2012 | Nakadaira et al. | |

OTHER PUBLICATIONS

International Search Report and Written Opinion for Application No. PCT/US2014/013770 dated May 14, 2014.

* cited by examiner

*Primary Examiner* — Chris Chu
(74) *Attorney, Agent, or Firm* — Lerner, David, Littenberg, Krumholz & Mentlik, LLP

(57) ABSTRACT

A microelectronic package can include a substrate having first and second opposed surfaces extending in first and second transverse directions and an opening extending between the first and second surfaces and defining first and second distinct parts each elongated along a common axis extending in the first direction, first and second microelectronic elements each having a front surface facing the first surface of the substrate and a column of contacts at the respective front surface, a plurality of terminals exposed at the second surface, and first and second electrical connections aligned with the respective first and second parts of the opening and extending from at least some of the contacts of the respective first and second microelectronic elements to at least some of the terminals. The column of contacts of the first and second microelectronic elements can be aligned with the respective first and second parts of the opening.

21 Claims, 2 Drawing Sheets

MULTI-DIE WIREBOND PACKAGES WITH ELONGATED WINDOWS

BACKGROUND OF THE INVENTION

The subject matter of the present application relates to microelectronic packages and assemblies incorporating microelectronic packages.

Semiconductor chips are commonly provided as individual, prepackaged units. A standard chip has a flat, rectangular body with a large front face having contacts connected to the internal circuitry of the chip. Each individual chip typically is contained in a package having external terminals connected to the contacts of the chip. In turn, the terminals, i.e., the external connection points of the package, are configured to electrically connect to a circuit panel, such as a printed circuit board. In many conventional designs, the chip package occupies an area of the circuit panel considerably larger than the area of the chip itself. As used in this disclosure with reference to a flat chip having a front face, the "area of the chip" should be understood as referring to the area of the front face.

In "flip chip" designs, the front face of the chip confronts the face of a package dielectric element, i.e., substrate of the package, and the contacts on the chip are bonded directly to contacts on the face of the substrate by solder bumps or other connecting elements. In turn, the substrate can be bonded to a circuit panel through the external terminals that overlie the substrate. The "flip chip" design provides a relatively compact arrangement; each package occupies an area of the circuit panel equal to or slightly larger than the area of the chip's front face, such as disclosed, for example, in certain embodiments of commonly-assigned U.S. Pat. Nos. 5,148,265; 5,148,266; and 5,679,977, the disclosures of which are incorporated herein by reference. Certain innovative mounting techniques offer compactness approaching or equal to that of conventional flip-chip bonding. Packages that can accommodate a single chip in an area of the circuit panel equal to or slightly larger than the area of the chip itself are commonly referred to as "chip-scale packages."

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/Os." These I/Os must be interconnected with the I/Os of other chips. The components that form the interconnections should not greatly increase the size of the assembly. Similar needs arise in other applications as, for example, in data servers such as those used in internet search engines where increased performance and size reduction are needed.

Semiconductor chips containing memory storage arrays, particularly dynamic random access memory chips (DRAMs) and flash memory chips are commonly packaged in single-chip or multiple-chip packages and assemblies. Each package has many electrical connections for carrying signals, power and ground between terminals and the chips therein. The electrical connections can include different kinds of conductors such as horizontal conductors, e.g., traces, beam leads, etc., which extend in a horizontal direction relative to a contact-bearing surface of a chip, vertical conductors such as vias, which extend in a vertical direction relative to the surface of the chip, and wire bonds that extend in both horizontal and vertical directions relative to the surface of the chip.

Besides minimizing the planar area of the circuit panel occupied by microelectronic assembly, it is also desirable to produce a chip package that presents a low overall height or dimension perpendicular to the plane of the circuit panel. Such thin microelectronic packages allow for placement of a circuit panel having the packages mounted therein in close proximity to neighboring structures, thus reducing the overall size of the product incorporating the circuit panel.

In light of the foregoing, certain improvements can be made to multi-chip microelectronic packages and assemblies in order to improve electrical performance. These attributes of the present invention can be achieved by the construction of the microelectronic packages and assemblies as described hereinafter.

BRIEF SUMMARY OF THE INVENTION

In accordance with an aspect of the invention, a microelectronic package can include a substrate having first and second opposed surfaces, each extending in a first direction and a second direction transverse to the first direction. The substrate can have a first opening extending between the first and second surfaces and defining first and second distinct parts each elongated along a first common axis extending in the first direction. The microelectronic package can also include first and second microelectronic elements each having a front surface facing the first surface of the substrate and a column of contacts at the respective front surface. The column of contacts of the first microelectronic element can be aligned with the first part of the first opening. The column of contacts of the second microelectronic element can be aligned with the second part of the first opening.

The microelectronic package can also include a plurality of terminals exposed at the second surface. The terminals can be configured for connecting the microelectronic package to at least one component external to the microelectronic package. The microelectronic package can also include first electrical connections aligned with the first part of the first opening extending from at least some of the contacts of the first microelectronic element to at least some of the terminals. The microelectronic package can also include second electrical connections aligned with the second part of the first opening extending from at least some of the contacts of the second microelectronic element to at least some of the terminals.

In one embodiment, the first and second microelectronic elements can each have a rear surface opposite the respective front surface, and the first and second microelectronic elements can each have: first and second opposed edges extending between the front and rear surface of the respective microelectronic element and extending in the first direction; and a first outer region adjacent the first edge, a second outer region adjacent the second edge, and a central region disposed between the first and second outer regions. Each of the first and second outer regions and the central region can have equal width such that the central region extends a middle third of a distance between the first and second edges. The contacts of the respective microelectronic element can be disposed in the respective central region.

In a particular example, the column of contacts of each of the first and second microelectronic elements can extend in a theoretical plane normal to the first surface of the substrate and containing the first common axis. In an exemplary embodiment, the front surfaces of the first and second microelectronic elements can be arranged in a single plane parallel to the first surface. In one example, the first microelectronic element can have an edge extending between the front and rear surfaces of the first microelectronic element and extending in the second direction. The front surface of the second microelectronic element can face the rear surface of the first microelectronic element and can project in the first direction beyond the edge of the first microelectronic element.

In a particular embodiment, each of the microelectronic elements can be configured to predominantly provide memory storage array function. In one embodiment, the microelectronic elements can be configured to function together as an addressable memory module. The microelectronic package can be configured to store part of data received in each of the microelectronic elements. In a particular example, at least some of the first electrical connections can include wire bonds extending through the first part of the first opening, and at least some of the second electrical connections can include wire bonds extending through the second part of the first opening.

In an exemplary embodiment, all of the first electrical connections can be wire bonds extending through the first part of the first opening, and all of the second electrical connections can be wire bonds extending through the second part of the first opening. In one example, at least some of the first electrical connections can include lead bonds aligned with the first part of the first opening, and at least some of the second electrical connections can include lead bonds aligned with the second part of the first opening. In a particular embodiment, the substrate can be an element consisting essentially of a material having a CTE in a plane of the substrate less than 12 ppm/° C.

In one embodiment, the substrate can have a second opening extending between the first and second surfaces and defining third and fourth distinct parts each elongated along a second common axis parallel to the first common axis. The microelectronic package can also include third and fourth microelectronic elements each having a front surface facing the first surface of the substrate and a column of contacts at the front surface. The column of contacts of the third microelectronic element can be aligned with the third part of the second opening, and the column of contacts of the fourth microelectronic element can be aligned with the fourth part of the second opening. The microelectronic package can also include third electrical connections aligned with the third part of the second opening extending from at least some of the contacts of the third microelectronic element to at least some of the terminals. The microelectronic package can also include fourth electrical connections aligned with the fourth part of the second opening extending from at least some of the contacts of the fourth microelectronic element to at least some of the terminals.

In a particular example, the third and fourth microelectronic elements can each have a rear surface opposite the respective front surface. The third and fourth microelectronic elements can each have: first and second opposed edges extending between the front and rear surface of the respective microelectronic element and extending in the first direction; and a first outer region adjacent the first edge, a second outer region adjacent the second edge, and a central region disposed between the first and second outer regions. Each of the first and second outer regions and the central region can have equal width such that the central region extends a middle third of a distance between the first and second edges. The contacts of the respective microelectronic element can be disposed in the respective central region.

In an exemplary embodiment, the column of contacts of each of the first and second microelectronic elements can extend in a first theoretical plane normal to the first surface of the substrate and containing the first common axis. The column of contacts of each of the third and fourth microelectronic elements can extend in a second theoretical plane normal to the first surface of the substrate and containing the second common axis. In one example, the front surfaces of the first, second, third, and fourth microelectronic elements can be arranged in a single plane parallel to the first surface.

In a particular embodiment, the first and second microelectronic elements can each have an edge extending between the respective front and rear surfaces and extending in the first direction. The front surface of the third microelectronic element can face the rear surface of the first microelectronic element and can project in the second direction beyond the edge of the first microelectronic element. The front surface of the fourth microelectronic element can face the rear surface of the second microelectronic element and can project in the second direction beyond the edge of the second microelectronic element.

In one embodiment, at least some of the first electrical connections can include wire bonds extending through the first part of the first opening and at least some of the second electrical connections can include wire bonds extending through the second part of the first opening. At least some of the third electrical connections can include wire bonds extending through the third part of the second opening and at least some of the fourth electrical connections can include wire bonds extending through the fourth part of the second opening.

In a particular example, all of the first electrical connections can be wire bonds extending through the first part of the first opening and all of the second electrical connections can be wire bonds extending through the second part of the first opening. All of the third electrical connections can be wire bonds extending through the third part of the second opening and all of the fourth electrical connections can be wire bonds extending through the fourth part of the second opening.

In an exemplary embodiment, at least some of the first electrical connections can include lead bonds aligned with the first part of the first opening and at least some of the second electrical connections can include lead bonds aligned with the second part of the first opening. At least some of the third electrical connections can include lead bonds aligned with the third part of the second opening and at least some of the fourth electrical connections can include lead bonds aligned with the fourth part of the second opening.

In one example, a microelectronic assembly can include microelectronic package as described above and a circuit panel having panel contacts, the terminals of the microelectronic package being bonded to the panel contacts. In a particular embodiment, a system can include a microelectronic package as described above and one or more other electronic components electrically connected to the microelectronic package. In one embodiment, the system can also include a housing, the microelectronic package and the other electronic components being mounted to the housing.

DETAILED DESCRIPTION

Certain embodiments of the invention provide a package or microelectronic assembly in which a microelectronic element, e.g., a semiconductor chip, or stacked arrangement of semiconductor chips, is configured to predominantly provide a memory storage array function. In such microelectronic element, the number of active devices, e.g., transistors, therein that are configured, i.e., constructed and interconnected with other devices, to provide memory storage array function, is greater than the number of active devices that are configured to provide any other function. Thus, in one example, a microelectronic element such as a DRAM chip may have memory storage array function as its primary or sole function. Alternatively, in another example, such microelectronic element may have mixed use and may incorporate active devices configured to provide memory storage array function, and may also incorporate other active devices configured to provide another function such as processor function, or signal processor or graphics processor function, among others. In this case, the microelectronic element may still have a greater number of active devices configured to provide the memory storage array function than any other function of the microelectronic element.

Embodiments of the invention herein provide packages that have more than one semiconductor chip, i.e., a microelectronic element therein. A multiple chip package can reduce the amount of area or space required to connect the chips therein to a circuit panel, e.g., printed wiring board to which the package may be electrically and mechanically connected through an array of terminals, such as a ball grid array, land grid array or pin grid array, among others. Such connection space is particularly limited in small or portable computing devices, e.g., handheld devices such as "smartphones" or tablets that typically combine the function of personal computers with wireless connectivity to the broader world. Multi-chip packages can be particularly useful for making large amounts of relatively inexpensive memory available to a system, such as advanced high performance dynamic random access memory ("DRAM") chips, e.g., in DDR3 type DRAM chips and its follow-ons.

The amount of area of the circuit panel needed to connect the multi-chip package thereto can be reduced by providing common terminals on the package through which at least some signals travel on their way to or from two or more chips within the package. However, doing so in a way that supports high performance operation presents challenges. To avoid undesirable effects such as undesirable reflections of the signal due to unterminated stubs, the traces, vias, and other conductors on a circuit panel that electrically connect the terminals at the exterior of the package with the global wiring on the circuit panel must not be too long. Heat dissipation also presents a challenge for advanced chips, such that it is desirable for at least one of the large flat surfaces of each chip to be coupled to a heat spreader or be exposed to or in thermal communication with a flow or air within an installed system. The packages described below can help to further these goals.

Figure 1A:
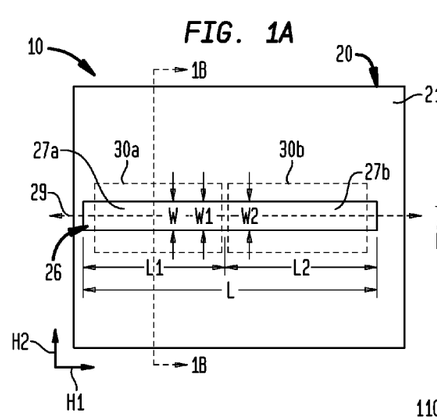
FIG. 1A is a diagrammatic top plan view of a microelectronic package according to an embodiment of the present invention.
Figure 1B:
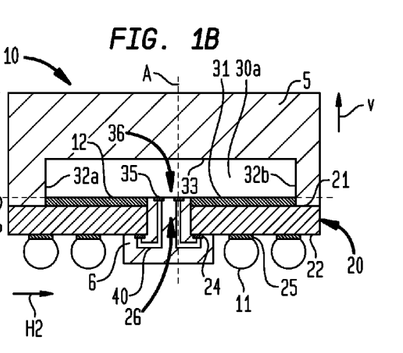
FIG. 1B is a side sectional view of the microelectronic package of FIG. 1A, taken along the line 1B-1B of FIG. 1A.

FIGS. 1A and 1B illustrate a particular type of microelectronic package 10 according to an embodiment of the invention. As seen in FIGS. 1A and 1B, the microelectronic package 10 can include packaging structure, for example, a substrate 20 having first and second opposed surfaces 21 and 22. In some cases, the substrate 20 can consist essentially of a material having a low coefficient of thermal expansion ("CTE") in a plane of the substrate (in a direction parallel to the first surface 21 of the substrate), i.e., a CTE of less than 12 parts per million per degree Celsius (hereinafter, "ppm/° C."), such as a semiconductor material e.g., silicon, or a dielectric material such as ceramic material or silicon dioxide, e.g., glass. Alternatively, the substrate 20 may include a sheet-like substrate that can consist essentially of a polymeric material such as polyimide, epoxy, thermoplastic, thermoset plastic, or other suitable polymeric material or that includes or consists essentially of composite polymeric-inorganic material such as a glass reinforced structure of BT resin (bismaleimide triazine) or epoxy-glass, such as FR-4, among others. In one example, such a substrate 20 can consist essentially of a material having a CTE of less than 30 ppm/° C. in the plane of the substrate, i.e., in a direction along its surface.

The first and second surfaces 21, 22 of the substrate 20 can each extend in a first direction H1 and a second direction H2 transverse to the first direction. In FIGS. 1A and 1B, the directions H1 and H2 parallel to the first surface 21 of the substrate 20 are referred to herein as "horizontal" or "lateral" directions, whereas the directions perpendicular to the first surface are referred to herein as upward or downward directions and are also referred to herein as the "vertical" directions. The directions referred to herein are in the frame of reference of the structures referred to. Thus, these directions may lie at any orientation to the normal "up" or "down" directions in a gravitational frame of reference.

A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

At least one window or opening 26 can extend between the first and second surfaces 21, 22 of the substrate 20. As can be seen in FIG. 1A, the substrate 20 can have one opening 26 extending therethrough. In other embodiments (e.g., FIGS. 3A and 3B), the substrate can have a plurality of openings extending therethrough).

As shown in FIG. 1A, the opening 26 can be elongated in the first direction H1, such that a long dimension or length L of the opening extending along the first direction is greater than a short dimension or width W of the opening extending along the second direction. The opening 26 can define first and second distinct parts 27a and 27b each elongated in the first direction H1, such that a long dimension or length L1 of the first part of the opening is greater than a short dimension or width W1 of the first part of the opening, and a long dimension or length L2 of the second part of the opening is greater than a short dimension or width W2 of the second part of the opening. As used herein, when an opening is described as defining first and second "distinct" parts, "distinct" means that the opening can be divided into first and second non-overlapping parts.

As can be seen in FIG. 1A, the first and second parts 27a, 27b of the opening 26 can each be elongated along a single common axis 29 extending in the first direction H1. As used herein, when an opening or a part of an opening is described as being elongated "along an axis," that means that the longer dimension of the opening or part of the opening extends parallel to the axis, and that the axis longitudinally bisects the opening or part of the opening. In FIG. 1A, the lengths L, L1, and L2 are the long dimensions of the opening 26, the first part 27a, and the second part 27b, respectively.

The substrate 20 can have a plurality of terminals 25, e.g., conductive pads, lands, or conductive posts or pins thereon. Such terminals 25 can be exposed at the second surface 22 of the substrate 20. The terminals 25 can function as endpoints for the connection of the microelectronic package 10 with corresponding electrically conductive elements of an external component such as a circuit panel, e.g., printed wiring board, flexible circuit panel, socket, other microelectronic assembly or package, interposer, or passive component assembly, among others (e.g., the circuit panel 402 shown in FIG. 4). In one example, such a circuit panel can be a motherboard or DIMM module board. In a particular embodiment, the terminals can be arranged in an area array such as a ball-grid array (BGA) (including joining elements as described below), a land-grid array (LGA), or a pin-grid array (PGA), among others. In one embodiment, the terminals 25 can be arranged along the periphery of the second surface 22 of the substrate 20.

As used in this disclosure, a statement that an electrically conductive element is "exposed at" a surface of a structure indicates that the electrically conductive element is available for contact with a theoretical point moving in a direction perpendicular to the surface toward the surface from outside the structure. Thus, a terminal or other conductive element which is exposed at a surface of a structure can project from such surface; can be flush with such surface; or can be recessed relative to such surface and exposed through a hole or depression in the structure.

The microelectronic package 10 can include joining elements 11 attached to the terminals 25 for connection with an external component. The joining elements 11 can be, for example, masses of a bond metal such as solder, tin, indium, a eutectic composition or combination thereof, or another joining material such as a conductive paste or a conductive adhesive. In a particular embodiment, the joints between the terminals 25 and contacts of an external component (e.g., the circuit panel 402 shown in FIG. 4) can include an electrically conductive matrix material such as described in commonly owned U.S. patent application Ser. Nos. 13/155,719 and 13/158,797, the disclosures of which are hereby incorporated by reference herein. In a particular embodiment, the joints can have a similar structure or be formed in a manner as described therein.

The microelectronic package 10 can also include a plurality of microelectronic elements 30a and 30b (collectively, the microelectronic elements 30) each having a front surface 31 facing the first surface 21 of the substrate 20 and a rear surface 33 opposite from the front surface. In the embodiment of FIGS. 1A and 1B, the front surfaces 31 of the first and second microelectronic elements 30a and 30b are arranged in a single plane P parallel to the first surface 21 of the substrate 20. In other embodiments (e.g., FIGS. 2A, 2B, 3B, and 3C), the front surfaces 31 of the microelectronic elements 30 need not be arranged in a single plane, as will be described below.

In one embodiment, each of the microelectronic elements 30 can be configured to predominantly provide memory storage array function. In an exemplary embodiment, the microelectronic elements 30 in the microelectronic package 10 can be configured to function together as an addressable memory module, the microelectronic package configured to store part of data received in each of the microelectronic elements.

In one example, each of the microelectronic elements 30 can be bare chips or microelectronic units each incorporating a memory storage element such as a dynamic random access memory ("DRAM") storage array or that is configured to predominantly function as a DRAM storage array (e.g., a DRAM integrated circuit chip). As used herein, a "memory storage element" refers to a multiplicity of memory cells arranged in an array, together with circuitry usable to store and retrieve data therefrom, such as for transport of the data over an electrical interface. In a particular example, the microelectronic package 10 can be included in a single in-line memory module ("SIMM") or a dual in-line memory module ("DIMM").

In a particular example, a microelectronic element 30 that includes a memory storage element can have at least a memory storage array function, but the microelectronic element may not be a full-function memory chip. Such a microelectronic element may not have a buffering function itself, but it may be electrically connected to other microelectronic elements in a stack of microelectronic elements, wherein at least one microelectronic element in the stack has a buffering function (the buffering microelectronic element could be a buffer chip, a full-function memory chip, or a controller chip).

In other examples, one or more of the microelectronic elements in any of the packages described herein can embody a greater number of active devices to provide memory storage array function than any other function, e.g., as flash memory, DRAM or other type of memory, and can be arranged in a package together with another microelectronic element or "logic chip" that is configured to predominantly provide logic function. In a particular embodiment, the logic chip can be a programmable or processor element such as a microprocessor or other general purpose computing element. The logic chip can be a microcontroller element, graphics processor, floating point processor, co-processor, digital signal processor, etc. In a particular embodiment, the logic chip can predominantly perform hardware state machine functions, or otherwise be hard-coded to serve a particular function or purpose. Alternatively, the logic chip can be an application specific integrated circuit ("ASIC") or field programmable gate array ("FPGA") chip. In such variation, the package then may be a "system in a package" ("SIP").

In another variation, a microelectronic element in any of the packages described herein can have both logic and memory function embedded therein, such as a programmable processor having one or more associated memory storage arrays embedded therewith in the same microelectronic element. Such microelectronic element is sometimes referred to as a "system-on-a-chip" ("SOC"), in that logic such as a processor is embedded together with other circuitry such as a memory storage array or circuitry for performing some other function that may be a specialized function.

Figure 1C:
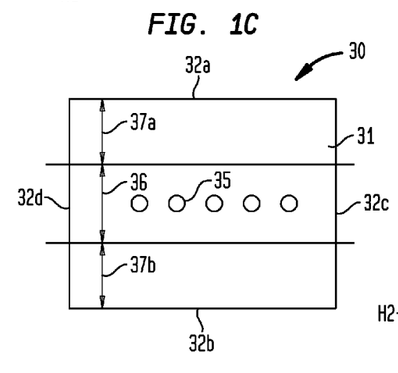
FIG. 1C is a bottom plan view of a microelectronic element of FIG. 1A.

As shown in FIG. 1C, the surface area of the front surface 31 of each microelectronic element 30 may be divided into three regions having substantially equal widths in a direction between the first and second opposed edges 32a, 32b of the first microelectronic element: a first outer region 37a, a second outer region 37b, and a central region 36 positioned between the first outer region and the second outer region. For example, if the length between the long edges is 6 microns, the respective lengths of the first outer, second outer, and central regions 37a, 37b, and 36 may be 2 microns. The central region 36 would therefore be positioned 2 microns from the first edge 37a and 2 microns from the second edge 37b. In other words, the central region 36 can be positioned in the middle third of the first microelectronic element 30. Each microelectronic element 30 may also have third and fourth opposed edges 32c, 32d extending in a direction between the front and rear surfaces 31, 33 and extending in a direction between the first and second opposed edges 32a, 32b.

In the embodiment shown in FIGS. 1A and 1B, the central region 36 of the first microelectronic element 30a can be at least partially aligned with the first part 27a of the opening 26, and the central region of the second microelectronic element 30b can be at least partially aligned with the second part 27b of the opening. In one example, the central region 36 of each of the microelectronic elements 30 can be aligned with the opening 26, such that a theoretical plane normal to the first surface 21 of the substrate 20 and containing the single common axis 29 of the opening can bisect each of the microelectronic elements between the first and second opposed edges 32a, 32b of the respective microelectronic element.

Each microelectronic element 30 can have a plurality of electrically conductive contacts 35 exposed at the front surface thereof. As shown in FIG. 1C, the contacts 35 of each microelectronic element 30 can be arranged in one or more columns disposed in the central region 36 of the front surface 31 that occupies a central portion of an area of the front surface. As shown in FIG. 1B, the contacts 35 of each microelectronic element 30 can be aligned with the opening 26.

In one example, the first and second opposed edges 32a and 32b of one or both microelectronic elements 30 can extend between the front and rear surfaces 31, 33 of the respective microelectronic element and can extend in the first direction H1, which can be the same direction in which the opening 26 is elongated. The contacts 35 of one or both microelectronic elements 30 can be disposed in the central region 36 of the front surface 31 of the respective microelectronic element. In one embodiment, a column of the contacts 35 of each microelectronic element can extend in a theoretical plane normal to the first surface 21 of the substrate 20 and containing the single common axis 29 of the first and second parts 27a, 27b of the opening 26.

As used herein, when one element is "aligned with" another element, the "alignment" is with respect to the horizontal directions H1 and H2, such that a line extending in a vertical direction V normal to the horizontal directions H1 and H2 intersects both of the aligned elements. For example, as shown in FIG. 1B, a contact 35 of the microelectronic element 30 being aligned with the opening 26 means that a line A extending in the vertical direction V can be drawn that intersects both the contact and the opening.

Figure 3A:
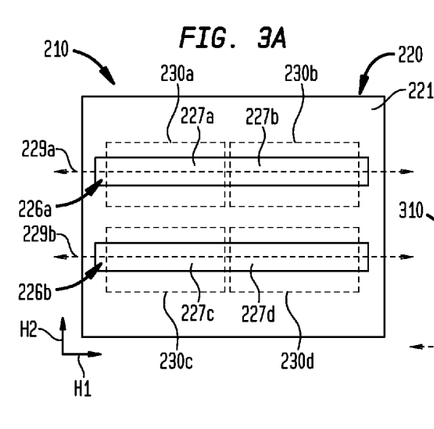
FIG. 3A is a diagrammatic top plan view of a variation of the microelectronic package of FIG. 1A, having four microelectronic elements overlying two elongated windows.
Figure 3B:
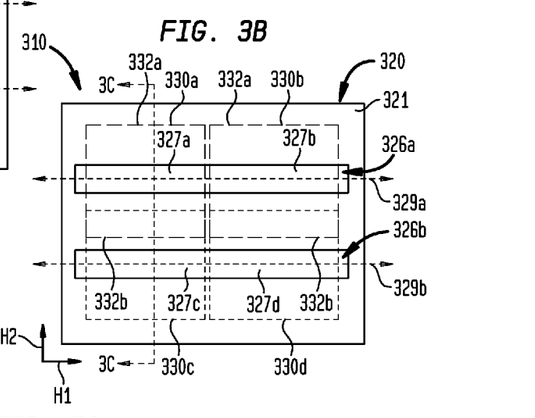
FIG. 3B is a diagrammatic top plan view of a variation of the microelectronic package of FIG. 3A, having two microelectronic elements at least partially overlying two other microelectronic elements, respectively.

In a particular embodiment (e.g., as shown in FIGS. 3A and 3B), the microelectronic package 10 can have four microelectronic elements 30, the contacts 35 of each microelectronic element including eight data I/O contacts. In another embodiment, the microelectronic package 10 can have four microelectronic elements 30, the contacts 35 of each microelectronic element including sixteen data I/O contacts. In a particular example, the microelectronic package 10 (and any of the other microelectronic packages described herein) can be configured to transfer, i.e., receive by the package, or transmit from the package thirty-two data bits in parallel in a clock cycle. In another example, the microelectronic package 10 (and any of the other microelectronic packages described herein) can be configured to transfer sixty-four data bits in parallel in a clock cycle. A number of other data transfer quantities are possible, among which only a few such transfer quantities will be mentioned without limitation. For example, the microelectronic package 10 (and any of the other microelectronic packages described herein) can be configured to transfer seventy-two data bits per clock cycle that can include a set of sixty-four underlying bits that represent data and eight bits that are error correction code ("ECC") bits for the sixty-four underlying bits. Ninety-six data bits, 108 bits (data and ECC bits), 128 data bits, and 144 bits (data and ECC bits) are other examples of data transfer widths per cycle that the microelectronic package 10 (and any of the other microelectronic packages described herein) can be configured to support.

In a particular example, each of the microelectronic elements 30 can be functionally and mechanically equivalent to the other ones of the microelectronic elements, such that each microelectronic element can have the same pattern of electrically conductive contacts 35 at the front surface 31 with the same function, although the particular dimensions of the length, width, and height of each microelectronic element can be different than that of the other microelectronic elements.

In one example, the microelectronic package 10 can have first and second microelectronic elements 30a, 30b each having a front surface 31 facing the first surface 21 of the substrate 20 and a column of contacts 35 at the front surface. The column of contacts 35 of the first microelectronic element 30a can be aligned with the first part 27a of the opening 26, and the column of contacts of the second microelectronic element 30b can be aligned with the second part 27b of the opening. In the embodiments of the invention described herein, having a single opening 26 underlie two or more microelectronic elements 30a and 30b may allow for easier formation of the microelectronic package 10 (e.g., fewer process steps, faster formation of openings in the substrate 20) because only a single opening needs to be formed at the locations of the substrate under which the two or more microelectronic elements 30a, 30b will be disposed.

Electrical connections between the contacts 35 of each microelectronic element 30 and the terminals 25 can include leads, e.g., wire bonds 40, or other possible structure in which at least portions of the leads are aligned with at least one of the openings 26. For example, as seen in FIG. 1B, at least some of the electrical connections can include a wire bond 40 that extends through an opening 26 in the substrate, and is joined to the contact 35 and a conductive element 24 of the substrate. In one embodiment, at least some of the electrical connections can include lead bonds. Such connections can include leads that extend along either or both of the first and second surfaces 21, 22 of the substrate 20 between the conductive elements 24 and the terminals 25. In a particular example, such leads can be electrically connected between the contacts 35 of each microelectronic element 30 and the terminals 25, each lead having a portion aligned with at least one of the openings 26.

In a particular embodiment, the microelectronic package 10 can include first electrical connections (e.g., wire bonds 40) aligned with the first part 27a of the opening 26 extending from at least some of the contacts 35 of the first microelectronic element 30a to at least some of the terminals 25, and second electrical connections aligned with the second part 27b of the opening extending from at least some of the contacts of the second microelectronic element 30b to at least some of the terminals.

In one example, at least some of the first electrical connections can include wire bonds 40 extending through the first part 27a of the opening 26, and at least some of the second electrical connections can include wire bonds extending through the second part 27b of the opening. In a particular example, all of the first electrical connections can be wire bonds 40 extending through the first part 27a of the opening 26, and all of the second electrical connections can be wire bonds extending through the second part 27b of the opening. In one embodiment, at least some of the first electrical connections can include lead bonds aligned with the first part 27a of the opening 26, and at least some of the second electrical connections can include lead bonds aligned with the second part 27b of the opening.

The microelectronic package 10 can further include an adhesive 12 between the front surface 31 of the first and second microelectronic elements 30a, 30b and the first surface 21 of the substrate 20. The microelectronic package 10 can also include an encapsulant 5 that can optionally cover, partially cover, or leave uncovered the rear surfaces 33 of the microelectronic elements 30. For example, in the package shown in FIGS. 1A and 1B, an encapsulant can be flowed, stenciled, screened or dispensed onto the rear surfaces 33 of the microelectronic elements 30. In another example, the encapsulant can be a mold compound which is formed thereon by overmolding.

The microelectronic package 10 can also include an underfill 6 that can be disposed between the first surface 21 of the substrate 20 and the contacts 35 at the front surface 31 of the microelectronic elements 30. In one example, the underfill 6 can extend around the electrical connections (e.g., wire bonds 40) between the contacts 35 of the microelectronic elements 30 and the conductive elements 24 of the substrate 20. In the embodiments of the invention described herein, having a single opening 26 underlie two or more microelectronic elements 30 may allow for easier depositing of the underfill 6 through the single opening (e.g., fewer process steps, less obstruction of the flow of the underfill, etc.) than if underfill had to be deposited under each microelectronic element through a separate corresponding opening.

In variations of the embodiments described above it is possible for the contacts of microelectronic elements to not be disposed in central regions of the surfaces thereof. Rather, the contacts may be disposed in one or more rows adjacent an edge of such microelectronic element. In another variation, the contacts of a microelectronic element can be disposed adjacent two opposed edges of such microelectronic element. In yet another variation, the contacts of a microelectronic element can be disposed adjacent any two edges, or be disposed adjacent more than two edges of such microelectronic element. In such cases, locations of the microelectronic elements relative to the substrate can be modified so that at least some of the contacts of the microelectronic elements are aligned with the openings in the substrate.

Figure 2A:
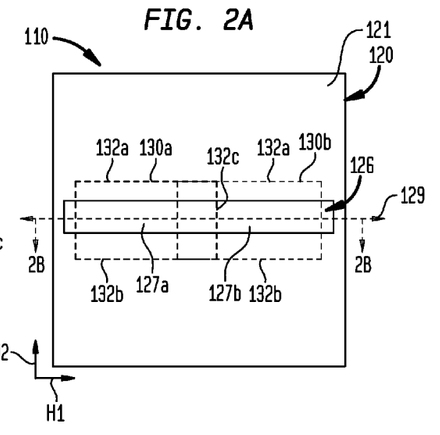
FIG. 2A is a diagrammatic top plan view of a microelectronic package having one microelectronic element at least partially overlying another microelectronic element.
Figure 2B:
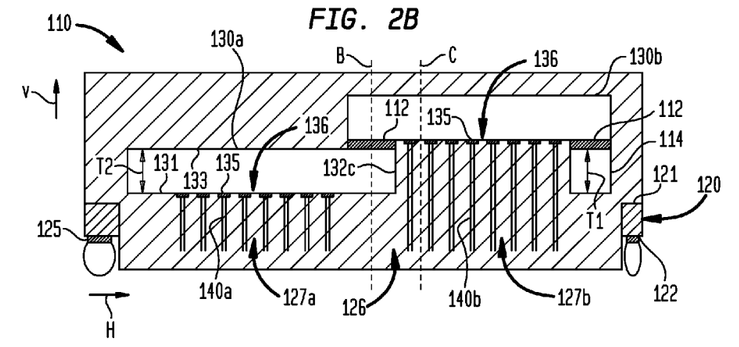
FIG. 2B is a side sectional view of the microelectronic package of FIG. 2A, taken along the line 2B-2B of FIG. 2A.

FIGS. 2A and 2B illustrate a microelectronic package 110 according to a variation of the embodiment described above relative to FIGS. 1A-1C, in which one of the microelectronic elements 130 partially overlies the other one of the microelectronic elements. As can be seen in FIG. 2B, the front surface 131 of the first microelectronic element 130a can be disposed adjacent the first surface 121 of the substrate 120. The first microelectronic element 130a can have front and rear opposed surfaces 131, 133 and an edge 132c (e.g., the third edge shown in FIG. 1C) extending between the front and rear surfaces and extending in the second direction H2. The front surface 131 of the second microelectronic element 130b can face the rear surface 133 of the first microelectronic element 130a and can project in the first direction H1 beyond the edge 132c of the first microelectronic element, such that the second microelectronic element partially overlies the first microelectronic element.

As used herein, when one element "overlies" another element, the "overlying" is with respect to the horizontal directions H1 and H2, such that a line extending in a vertical direction V normal to the horizontal directions H1 and H2 intersects both of the elements involved in the overlying. For example, as shown in FIG. 2B, the second microelectronic element 130b partially overlies the first microelectronic element 130a, which means that a line B extending in the vertical direction V can be drawn that intersects both microelectronic elements. The "partially" portion of the "partially overlies" term indicates that the overlying element has a partial portion that extends beyond an edge of the underlying element, such that a line extending in a vertical direction V normal to the horizontal directions H1 and H2 intersects the overlying element but not the underlying element. For example, as shown in FIG. 2B, the second microelectronic element 130b has a portion that extends beyond the edge 132c of the first microelectronic element 130a, such that a line C extending in the vertical direction V can be drawn that intersects the second microelectronic element but not the first microelectronic element.

Although the second microelectronic element 130b partially overlies the first microelectronic element 130a, the central region 136 of each of the microelectronic elements 130 can still be aligned with the window or opening 126 in a manner similar to the embodiment of FIG. 1A, such that a theoretical plane normal to the first surface 121 of the substrate 120 and containing the single common axis 129 of the opening can bisect each of the microelectronic elements between the first and second opposed edges 132a, 132b of the respective microelectronic element.

As can be seen in FIG. 2B, the microelectronic package 110 can include first electrical connections 140a aligned with the first part 127a of the opening 126 extending from at least some of the contacts 135 of the first microelectronic element 130a to at least some of the terminals 125. The microelectronic package 110 can further include first electrical connections 140b aligned with the second part 127b of the opening 126 extending from at least some of the contacts 135 of the second microelectronic element 130b to at least some of the terminals 125.

As can be seen in FIG. 2B, an adhesive 112 can be used to bond a portion of the front surface 131 of the second microelectronic element 130b to a portion of the rear surface 133 of the first microelectronic element 130a. A spacer 114 can be positioned between the front surface 131 of the second microelectronic elements 130b and a portion of the first surface 121 of the substrate 120, with or without an adhesive 112 located between the spacer and the first surface of the substrate. Such a spacer 114 can be made, for example, from a dielectric material such as silicon dioxide, a semiconductor material such as silicon, or one or more layers of adhesive. If the spacer 114 includes adhesives, the adhesives can connect the second microelectronic element 130b to the substrate 120. In one embodiment, the spacer 114 can have substantially the same thickness T1 in the vertical direction V substantially perpendicular to the first surface 121 of the substrate 120 as the thickness T2 of the first microelectronic element 130a between the front and rear surfaces 31, 33 thereof. In a particular embodiment, for example, when the spacer 114 is made of an adhesive material, the spacer 114 can be used without an adhesive 112.

FIG. 3A illustrates a microelectronic package 210 according to a variation of the embodiment described above relative to FIGS. 1A-1C, in which two microelectronic elements 130 overlie a first window or opening 226a of the substrate 220, and two microelectronic elements overlie a second window or opening 226b of the substrate.

In the microelectronic package 210, the substrate 220 has first and second openings 226a, 226b each extending between the first and second opposed surfaces of the substrate. The first opening 226a can define first and second distinct parts 227a, 227b each elongated in the first horizontal direction H1, and the second opening 226b can define third and fourth distinct parts 227c, 227d elongated in the first horizontal direction. The first and second openings 226a, 226b extend in the first horizontal direction H1 along respective first and second parallel axes 229a, 229b.

The microelectronic package 210 can have first, second, third, and fourth microelectronic elements 230a, 230b, 230c, and 230d each having a front surface facing the first surface 221 of the substrate 220. Each microelectronic element 230 can have a column of contacts at the respective front surface. In one example, the column of contacts of the first microelectronic element 230a can be aligned with the first part 227a of the first opening 226a, the column of contacts of the second microelectronic element 230b can be aligned with the second part 227b of the first opening 226a, the column of contacts of the third microelectronic element 230c can be aligned with the third part 227c of the second opening 226b, and the column of contacts of the fourth microelectronic element 230d can be aligned with the fourth part 227d of the second opening 226b.

In the embodiments of the invention described herein, having a single first opening 226a underlie two or more microelectronic elements 230a and 230b, and having a single second opening 226b underlie two or more microelectronic elements 230c and 230d may allow for easier formation of the microelectronic package 210 (e.g., fewer process steps, faster formation of openings in the substrate 220) because only a single first opening 226a needs to be formed at the locations of the substrate under which the two or more microelectronic elements 230a, 230b will be disposed, and because only a single second opening 226b needs to be formed at the locations of the substrate under which the two or more microelectronic elements 230c, 230d will be disposed.

In the embodiment of FIG. 3A, the front surfaces 231 of the first, second, third, and fourth microelectronic elements 230a, 230b, 230c, and 230d are arranged in a single plane parallel to the first surface 221 of the substrate 220.

In a particular embodiment, the microelectronic package 210 can include first electrical connections aligned with the first part 227a of the first opening 226a extending from at least some of the contacts of the first microelectronic element 230a to at least some of the terminals at the second surface of the substrate 220, second electrical connections aligned with the second part 227b of the first opening 226a extending from at least some of the contacts of the second microelectronic element 230b to at least some of the terminals, third electrical connections aligned with the third part 227c of the second opening 226b extending from at least some of the contacts of the third microelectronic element 230c to at least some of the terminals, and fourth electrical connections aligned with the fourth part 227d of the second opening 226b extending from at least some of the contacts of the fourth microelectronic element 230d to at least some of the terminals.

In one example, at least some of the first, second, third, and fourth electrical connections can include wire bonds extending through the respective first, second, third, and fourth parts 227a, 227b, 227c, and 227b of the openings 226. In a particular example, all of the first, second, third, and fourth electrical connections can be wire bonds extending through the respective first, second, third, and fourth parts 227a, 227b, 227c, and 227b of the openings 226. In one embodiment, at least some of the first, second, third, and fourth electrical connections can include lead bonds aligned with the respective first, second, third, and fourth parts 227a, 227b, 227c, and 227b of the openings 226.

Figure 3C:
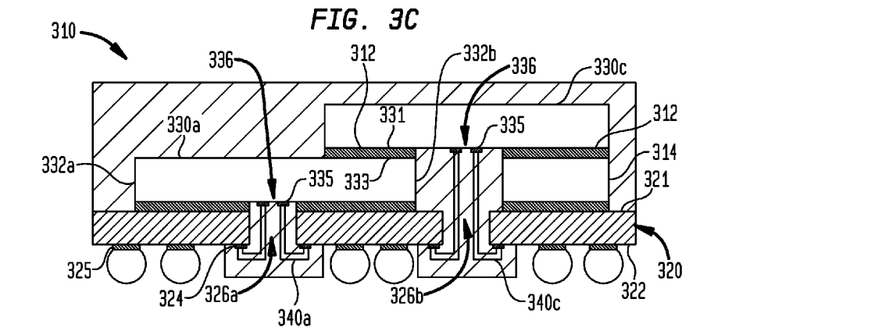
FIG. 3C is a side sectional view of the microelectronic package of FIG. 3B, taken along the line 3C-3C of FIG. 3B.

FIGS. 3B and 3C illustrate a microelectronic package 310 according to a variation of the embodiment described above relative to FIG. 3A, in which two of the microelectronic elements 330 partially overlies the other two of the microelectronic elements. As can be seen in FIGS. 3B and 3C, the front surface 331 of each of the first and second microelectronic elements 330a and 330b can be disposed adjacent the first surface 321 of the substrate 320. The first and second microelectronic elements 330a, 330b can each have front and rear opposed surfaces 331, 333 and an edge 332b (e.g., the second edge shown in FIG. 1C) extending between the front and rear surfaces and extending in the first direction H1.

The front surface 331 of the third microelectronic element 330c can face the rear surface 333 of the first microelectronic element 330a and can project in the second horizontal direction H2 beyond the edge 332b of the first microelectronic element, such that the third microelectronic element partially overlies the first microelectronic element. The front surface 331 of the fourth microelectronic element 330d can face the rear surface 333 of the second microelectronic element 330b and can project in the second horizontal direction H2 beyond the edge 332b of the second microelectronic element, such that the fourth microelectronic element partially overlies the second microelectronic element. The front surfaces 331 of the first and second microelectronic elements 330a and 330b can be arranged in a single plane parallel to the first surface 321 of the substrate 320.

Although the third and fourth microelectronic elements 330c and 330d partially overlies the first and second microelectronic elements 330a and 330b, respectively, the central region 336 of each of the first and second microelectronic elements 330a and 330b can still be aligned with the first window or opening 326a in a manner similar to the embodiment of FIG. 3A, such that a first theoretical plane normal to the first surface 321 of the substrate 320 and containing a first common axis 329a of the first opening can bisect each of the first and second microelectronic elements between the first and second opposed edges 332a, 332b of the respective microelectronic element 330a and 330b, and the central region of each of the third and fourth microelectronic elements 330c and 330d can still be aligned with the second window or opening 326b in a manner similar to the embodiment of FIG. 3A, such that a second theoretical plane normal to the first surface of the substrate and containing a second common axis 329b of the second opening can bisect each of the third and fourth microelectronic elements between the first and second opposed edges 332a, 332b of the respective microelectronic element 330c and 330d.

As can be seen in FIG. 3C for example, the first, second, third, and fourth microelectronic elements 330a, 330b, 330c, and 330d can include respective first, second, third, and fourth electrical connections 340 extending between contacts 335 of the microelectronic elements and terminals 325 exposed at the second surface 322 of the substrate 320. In the example shown in FIG. 3C, the first, second, third, and fourth electrical connections 340 extend through the respective first, second, third, and forth parts 327a, 327b, 327c, and 327d of the openings 326 between contacts 335 of the microelectronic elements 330 and conductive elements 324 of the substrate. Similar to the other embodiments described herein, the first, second, third, and fourth electrical connections 340 of the embodiment of FIGS. 3B and 3C can include some wire bonds, can all be wire bonds, or can include lead bonds.

Similar to the embodiment shown in FIGS. 2A and 2B, an adhesive 312 can be used to bond a portion of the front surface 331 of the third and fourth microelectronic elements 330c and 330d to a portion of the rear surface 133 of the first and second microelectronic elements 330a and 330b, respectively. A spacer 314 can be positioned between the front surface 331 of the third and fourth microelectronic elements 330c and 330d and a portion of the first surface 321 of the substrate 320.

Figure 4:
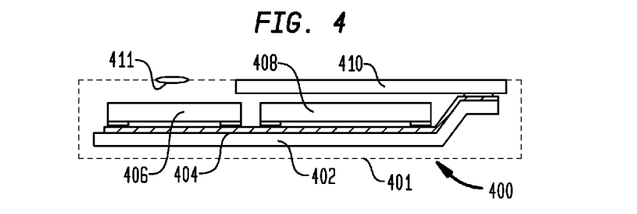
FIG. 4 is a schematic depiction of a system according to one embodiment of the invention.

The microelectronic packages and microelectronic assemblies described above with reference to FIGS. 1A through 3C above can be utilized in construction of diverse electronic systems, such as the system 400 shown in FIG. 4. For example, the system 400 in accordance with a further embodiment of the invention includes a plurality of modules or components 406 such as the microelectronic packages 10, 110, 210, and 310 described above in conjunction with other electronic components 408, 410 and 411.

In the exemplary system 400 shown, the system can include a circuit panel, motherboard, or riser panel 402 such as a flexible printed circuit board, and the circuit panel can include numerous conductors 404, of which only one is depicted in FIG. 4, interconnecting the modules or components 406, 408, 410 with one another. Such a circuit panel 402 can transport signals to and from each of the microelectronic packages included in the system 400. However, this is merely exemplary; any suitable structure for making electrical connections between the modules or components 406 can be used.

In a particular embodiment, the system 400 can also include a processor such as the semiconductor chip 408, such that each module or component 406 can be configured to transfer a number N of data bits in parallel in a clock cycle, and the processor can be configured to transfer a number M of data bits in parallel in a clock cycle, M being greater than or equal to N.

In one example, the system 400 can include a processor chip 408 that is configured to transfer thirty-two data bits in parallel in a clock cycle, and the system can also include four modules 406 such as the microelectronic package 10 described with reference to FIGS. 1A-1C, each module 106 configured to transfer eight data bits in parallel in a clock cycle (i.e., each module 406 can include first and second microelectronic elements, each of the two microelectronic elements being configured to transfer four data bits in parallel in a clock cycle).

In another example, the system 400 can include a processor chip 408 that is configured to transfer sixty-four data bits in parallel in a clock cycle, and the system can also include four modules 406 such as the microelectronic package described with reference to any one of FIGS. 3A-3C, each module 406 configured to transfer sixteen data bits in parallel in a clock cycle (i.e., each module 406 can include four microelectronic elements, each of the four microelectronic elements being configured to transfer four data bits in parallel in a clock cycle).

In the example depicted in FIG. 4, the component 408 is a semiconductor chip and component 410 is a display screen, but any other components can be used in the system 400. Of course, although only two additional components 408 and 411 are depicted in FIG. 4 for clarity of illustration, the system 400 can include any number of such components.

Modules or components 406 and components 408 and 411 can be mounted in a common housing 401, schematically depicted in broken lines, and can be electrically interconnected with one another as necessary to form the desired circuit. The housing 401 is depicted as a portable housing of the type usable, for example, in a cellular telephone or personal digital assistant, and screen 410 can be exposed at the surface of the housing. In embodiments where a structure 406 includes a light-sensitive element such as an imaging chip, a lens 411 or other optical device also can be provided for routing light to the structure. Again, the simplified system shown in FIG. 4 is merely exemplary; other systems, including systems commonly regarded as fixed structures, such as desktop computers, routers and the like can be made using the structures discussed above.

In any or all of the microelectronic packages described in the foregoing, the rear surface of one or more of the microelectronic elements can be at least partially exposed at an exterior surface of the microelectronic package after completing fabrication. Thus, in the microelectronic package 10 described above with respect to FIG. 1A, the rear surface 33 of the microelectronic elements 30 can be partially or fully exposed at an exterior surface of the encapsulant 5 in the completed microelectronic package 10.

In any of the embodiments described above, the microelectronic package may include a heat spreader partly or entirely made of any suitable thermally conductive material. Examples of suitable thermally conductive material include, but are not limited to, metal, graphite, thermally conductive adhesives, e.g., thermally-conductive epoxy, a solder, or the like, or a combination of such materials. In one example, the heat spreader can be a substantially continuous sheet of metal.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:
1. A microelectronic package, comprising:
 a substrate having first and second opposed surfaces, each extending in a first direction and a second direction transverse to the first direction, the substrate having a first opening extending between the first and second surfaces and defining first and second distinct parts each elongated along a first common axis extending in the first direction;
 first and second microelectronic elements each having a front surface facing the first surface of the substrate and a column of contacts at the respective front surface, the column of contacts of the first microelectronic element aligned with the first part of the first opening, the column of contacts of the second microelectronic element aligned with the second part of the first opening;
 a plurality of terminals exposed at the second surface, the terminals configured for connecting the microelectronic package to at least one component external to the microelectronic package;

first electrical connections aligned with the first part of the first opening extending from at least some of the contacts of the first microelectronic element to at least some of the terminals; and second electrical connections aligned with the second part of the first opening extending from at least some of the contacts of the second microelectronic element to at least some of the terminals, wherein the first and second microelectronic elements each have a rear surface opposite the respective front surface, and wherein the first and second microelectronic elements each have:

first and second opposed edges extending between the front and rear surface of the respective microelectronic element and extending in the first direction; and a first outer region adjacent the first edge, a second outer region adjacent the second edge, and a central region disposed between the first and second outer regions, each of the first and second outer regions and the central region having equal width such that the central region extends a middle third of a distance between the first and second edges, wherein the contacts of the respective microelectronic element are disposed in the respective central region.

2. The microelectronic package as claimed in claim 1, wherein the column of contacts of each of the first and second microelectronic elements extends in a theoretical plane normal to the first surface of the substrate and containing the first common axis.

3. The microelectronic package as claimed in claim 1, wherein the front surfaces of the first and second microelectronic elements are arranged in a single plane parallel to the first surface.

4. The microelectronic package as claimed in claim 1, wherein the first microelectronic element has an edge extending between the front and rear surfaces of the first microelectronic element and extending in the second direction, and wherein the front surface of the second microelectronic element faces the rear surface of the first microelectronic element and projects in the first direction beyond the edge of the first microelectronic element.

5. The microelectronic package as claimed in claim 1, wherein each of the microelectronic elements is configured to predominantly provide memory storage array function.

6. The microelectronic package as claimed in claim 1, wherein the microelectronic elements are configured to function together as an addressable memory module, the microelectronic package configured to store part of data received in each of the microelectronic elements.

7. The microelectronic package as claimed in claim 1, wherein at least some of the first electrical connections include wire bonds extending through the first part of the first opening, and wherein at least some of the second electrical connections include wire bonds extending through the second part of the first opening.

8. The microelectronic package as claimed in claim 1, wherein all of the first electrical connections are wire bonds extending through the first part of the first opening, and wherein all of the second electrical connections are wire bonds extending through the second part of the first opening.

9. The microelectronic package as claimed in claim 1, wherein at least some of the first electrical connections include lead bonds aligned with the first part of the first opening, and wherein at least some of the second electrical connections include lead bonds aligned with the second part of the first opening.

10. The microelectronic package as claimed in claim 1, wherein the substrate is an element consisting essentially of a material having a CTE in a plane of the substrate less than 12 ppm/° C.

11. The microelectronic package as claimed in claim 1, wherein the substrate has a second opening extending between the first and second surfaces and defining third and fourth distinct parts each elongated along a second common axis parallel to the first common axis, the microelectronic package further comprising:

third and fourth microelectronic elements each having a front surface facing the first surface of the substrate and a column of contacts at the front surface, the column of contacts of the third microelectronic element aligned with the third part of the second opening, the column of contacts of the fourth microelectronic element aligned with the fourth part of the second opening;

third electrical connections aligned with the third part of the second opening extending from at least some of the contacts of the third microelectronic element to at least some of the terminals; and fourth electrical connections aligned with the fourth part of the second opening extending from at least some of the contacts of the fourth microelectronic element to at least some of the terminals.

12. The microelectronic package as claimed in claim 11, wherein the third and fourth microelectronic elements each have a rear surface opposite the respective front surface, and wherein the third and fourth microelectronic elements each have:

first and second opposed edges extending between the front and rear surface of the respective microelectronic element and extending in the first direction; and a first outer region adjacent the first edge, a second outer region adjacent the second edge, and a central region disposed between the first and second outer regions, each of the first and second outer regions and the central region having equal width such that the central region extends a middle third of a distance between the first and second edges, wherein the contacts of the respective microelectronic element are disposed in the respective central region.

13. The microelectronic package as claimed in claim 12, wherein the column of contacts of each of the first and second microelectronic elements extends in a first theoretical plane normal to the first surface of the substrate and containing the first common axis, and wherein the column of contacts of each of the third and fourth microelectronic elements extends in a second theoretical plane normal to the first surface of the substrate and containing the second common axis.

14. The microelectronic package as claimed in claim 11, wherein the front surfaces of the first, second, third, and fourth microelectronic elements are arranged in a single plane parallel to the first surface.

15. The microelectronic package as claimed in claim 11, wherein the first and second microelectronic elements each have an edge extending between the respective front and rear surfaces and extending in the first direction, and wherein the front surface of the third microelectronic element faces the rear surface of the first microelectronic element and projects in the second direction beyond the edge of the first microelectronic element, and wherein the front surface of the fourth microelectronic element faces the rear surface of the second microelectronic element and projects in the second direction beyond the edge of the second microelectronic element.

16. The microelectronic package as claimed in claim 11, wherein at least some of the first electrical connections include wire bonds extending through the first part of the first opening and at least some of the second electrical connections include wire bonds extending through the second part of the first opening, and wherein at least some of the third electrical connections include wire bonds extending through the third part of the second opening and at least some of the fourth electrical connections include wire bonds extending through the fourth part of the second opening.

17. The microelectronic package as claimed in claim 11, wherein all of the first electrical connections are wire bonds extending through the first part of the first opening and all of the second electrical connections are wire bonds extending through the second part of the first opening, and wherein all of the third electrical connections are wire bonds extending through the third part of the second opening and all of the fourth electrical connections are wire bonds extending through the fourth part of the second opening.

18. The microelectronic package as claimed in claim 11, wherein at least some of the first electrical connections include lead bonds aligned with the first part of the first opening and at least some of the second electrical connections include lead bonds aligned with the second part of the first opening, and wherein at least some of the third electrical connections include lead bonds aligned with the third part of the second opening and at least some of the fourth electrical connections include lead bonds aligned with the fourth part of the second opening.

19. A microelectronic assembly including the microelectronic package as claimed in claim 1, further comprising a circuit panel having panel contacts, wherein the terminals of the microelectronic package are bonded to the panel contacts.

20. A system comprising a microelectronic package according to claim 1 and one or more other electronic components electrically connected to the microelectronic package.

21. The system as claimed in claim 20, further comprising a housing, the microelectronic package and the other electronic components being mounted to the housing.

\* \* \* \* \*